(12) United States Patent
Yasuda

(10) Patent No.: US 6,218,709 B1
(45) Date of Patent: Apr. 17, 2001

(54) SEMICONDUCTOR DEVICE AND SEMICONDUCTOR CIRCUIT USING THE SAME

(75) Inventor: Yukio Yasuda, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/326,605

(22) Filed: Jun. 7, 1999

(30) Foreign Application Priority Data

Dec. 17, 1998 (JP) .................................................. 10-358817

(51) Int. Cl.$^7$ .............................. H01L 29/76; H01L 29/74
(52) U.S. Cl. ......................... 257/378; 257/133; 257/146; 257/339; 257/370
(58) Field of Search ..................................... 257/140, 146, 257/173, 133, 135, 106, 603, 328, 212, 378, 370, 339, 273

(56) References Cited

U.S. PATENT DOCUMENTS 5,162,966 * 11/1992 Fujihira ................................. 257/140
5,631,494 * 5/1997 Sakurai et al. ........................ 257/572

FOREIGN PATENT DOCUMENTS

63288064A * 5/1987 (JP) .................................. H01L/2/74

OTHER PUBLICATIONS

K. Yoshida, et al., "A Self–Isolated Intelligent IGBT For Driving Ignition Coils", Proceedings of 1998 International Symposium on Power Semiconductor Devices & Ics, Kyoto, pp. 105–108.

* cited by examiner

Primary Examiner—Tom Thomas
Assistant Examiner—Shouxiang Hu
(74) Attorney, Agent, or Firm—Oblon, Spivak, McClelland, Maier & Neustadt, P.C.

(57) ABSTRACT

An inexpensive semiconductor device in which an insulated gate bipolar transistor and a terminal, capable of drawing out a limited current or voltage from a collector of the insulated gate bipolar transistor, are mounted on a semiconductor substrate, and a semiconductor circuit using the same.

The semiconductor device comprising an insulated gate bipolar transistor having a gate formed through a gate insulator on an n-type semiconductor layer formed on a p-type semiconductor substrate, and a thyristor, the thyrister comprising a p-type region where a p-type impurity diffuses over a part of the n-type semiconductor layer, an n-type region where an n-type impurity diffuses over a part of the p-type region, an emitter electrode formed contiguously to the n-type region, a base electrode formed contiguously to the p-type region, and a collector electrode which is used in common with the insulated gate bipolar transistor.

5 Claims, 5 Drawing Sheets

Fig. 6 Prior Art

Fig. 7 *Prior Art*
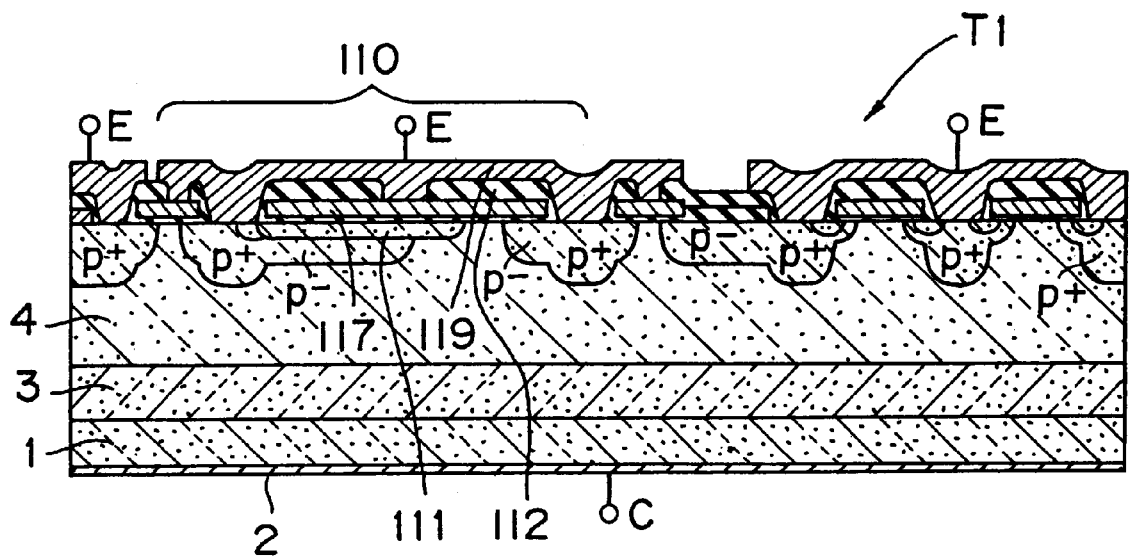
Fig. 8 *Prior Art*
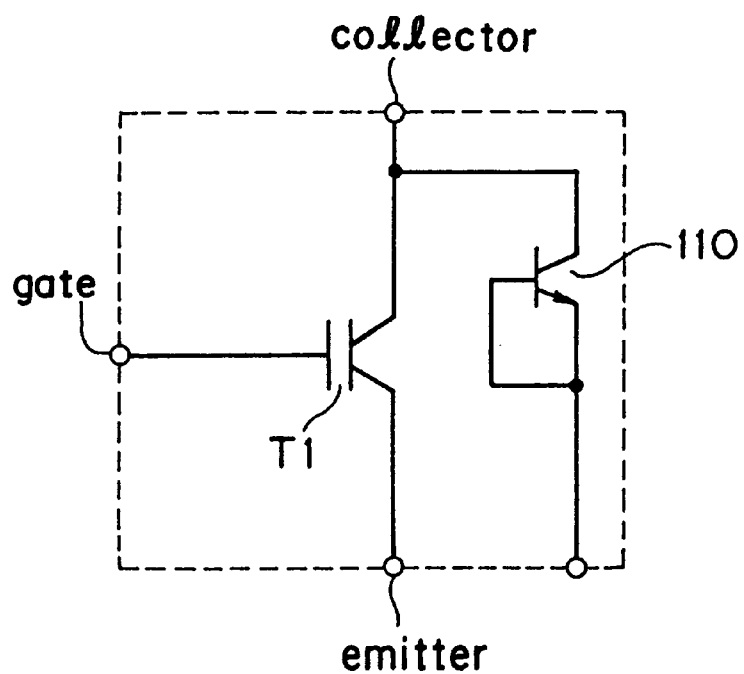

SEMICONDUCTOR DEVICE AND SEMICONDUCTOR CIRCUIT USING THE SAME

BACKGROUND OF THE INVENTION

1. Field of the Invention

The present invention relates to a semiconductor device comprising an insulated gate bipolar transistor, and a semiconductor circuit using the same.

2. Description of the Prior Art

Power semiconductor devices represented by an insulated gate bipolar transistor are used to control various power equipments. In a control circuit using this insulated gate bipolar transistor, it is necessary to put out a collector current by placing a limitation in order to indirectly detect a state of a load $R_L$ connected with the collector and also improve oscillation stability of a feedback circuit by entering a signal from the collector to the feedback circuit.

In such cases, the prior art, as shown in FIG. 6, is devised to draw out a limited current or voltage through a resistor R10 having high resistance from a control terminal 100. In FIG. 6, Z10 is a zener diode used to limit a voltage across the control terminal to less than a certain voltage and T1 is the insulated gate bipolar transistor.

Recently, a semiconductor device comprising an insulated gate bipolar transistor T1 as shown in FIG. 7 has also been proposed.

The semiconductor device shown in FIG. 7 uses a depletion type IGBT110 formed adjacent to the insulated gate bipolar transistor T1, in place of the resistor R10 of high resistance, therethrough attempting to detect a collector voltage.

That is, in the depletion type IGBT110, an n-type impurity is diffused in a channel region to form an n⁻ depletion region 111, thus connecting a gate electrode 117 and an emitter electrode 119, which are disposed above the n⁻ depletion region 111, by way of an opening formed on an insulating film 112. Consequently, a circuit as shown in FIG. 8 can thus be configured, in which the depletion type IGBT110 turns to be a state of ON even if a bias voltage between the gate electrode and the emitter electrode is zero (0), thereby drawing out the collector voltage or current.

However, there is a problem that the resistor of high resistance must be mounted separately in a circuitry of the prior art shown in FIG. 6 because it is difficult to form the resistor of high resistance integrally with the insulated gate bipolar transistor on the semiconductor substrate. With the construction of FIG. 7, there also is a problem of complicated step because a diffusing step is further required to form the n⁻ depletion region 111.

SUMMARY OF THE INVENTION

An object of the present invention is to provide an inexpensive semiconductor device which is integrally equipped with an insulated gate bipolar transistor and a terminal, capable of drawing out a limited current or voltage from a collector of the insulated gate bipolar transistor, on a semiconductor substrate, and a semiconductor circuit using the semiconductor device.

The present invention has been accomplished to attain the object described above.

The semiconductor device of the present invention is a semiconductor device comprising an insulated gate bipolar transistor provided with a gate formed through a gate insulator on an n-type semiconductor layer formed on a p-type semiconductor substrate, the semiconductor device further comprising a thyristor apart from the insulated gate bipolar transistor, the thyristor comprising a p-type region where a p-type impurity diffuses over a part of the n-type semiconductor layer, an n-type region where an n-type impurity diffuses over a part of said p-type region, an emitter electrode formed contiguously to the n-type region, a base electrode formed contiguously to the p-type region, and a collector electrode which is used in common with the insulated gate bipolar transistor.

In the semiconductor device thus configured, the p-type region and the n-type region can be formed concurrently with the p-type region and n-type region of the insulated gate bipolar transistor, respectively, and the limited voltage or current of the collector voltage or current of the insulated gate bipolar transistor can be drawn out from the emitter electrode.

According to the semiconductor device of the present invention, it is preferable that the second p-type region is formed in the n-type semiconductor layer by diffusing the p-type impurity between the insulated gate bipolar transistor and the thyristor to prevent the withstanding voltage characteristics from being degraded.

Furthermore, according to the semiconductor device of the present invention, in order to more effectively prevent degradation of withstanding voltage characteristics, it is preferable that the second p-type region is formed in the n-type semiconductor layer at both sides of the thyristor, and that an electrode made of the same material as that used for the gate is formed through an insulating film so as to cover between the p-type region and the second p-type region and a part of the p-type region and the second p-type region, thereby connecting the electrode and the emitter electrode.

Also the semiconductor circuit of the present invention is characterized by having the semiconductor device and a zener diode connected with the base electrode. With this construction, it is made possible to positively restrict a voltage of the base electrode to less than a yield voltage of the zener diode, thereby drawing out a voltage less than the base voltage from the emitter electrode.

Also according to the semiconductor circuit of the present invention, in order to draw out a current from the emitter electrode, it is preferable that different diode other than the zener diode is connected to the emitter electrode.

Furthermore, in the semiconductor circuit, it is made possible to connect a control circuit through the diode to the semiconductor device.

BRIEF DESCRIPTION OF THE DRAWINGS

FIG. 6 is a circuit diagram showing the semiconductor circuit using the insulated gate bipolar transistor of the prior art;

FIG. 7 is a sectional view schematically showing the depletion type IGBT of the prior art;

FIG. 8 is an equivalent circuit of the depletion type IGBT of the prior art.

DETAILED DESCRIPTION OF THE PREFERRED EMBODIMENTS

Now a preferred embodiment of the present invention will be described below with reference to the accompanying drawings.

Embodiment 1

The semiconductor device according to the first embodiment of the present invention comprises an insulated gate bipolar transistor T1 having a gate which is formed through a gate insulator on a p-type semiconductor substrate, characterized in that a thyristor 20 is formed integral with the insulated gate bipolar transistor T1.

Figure 1:
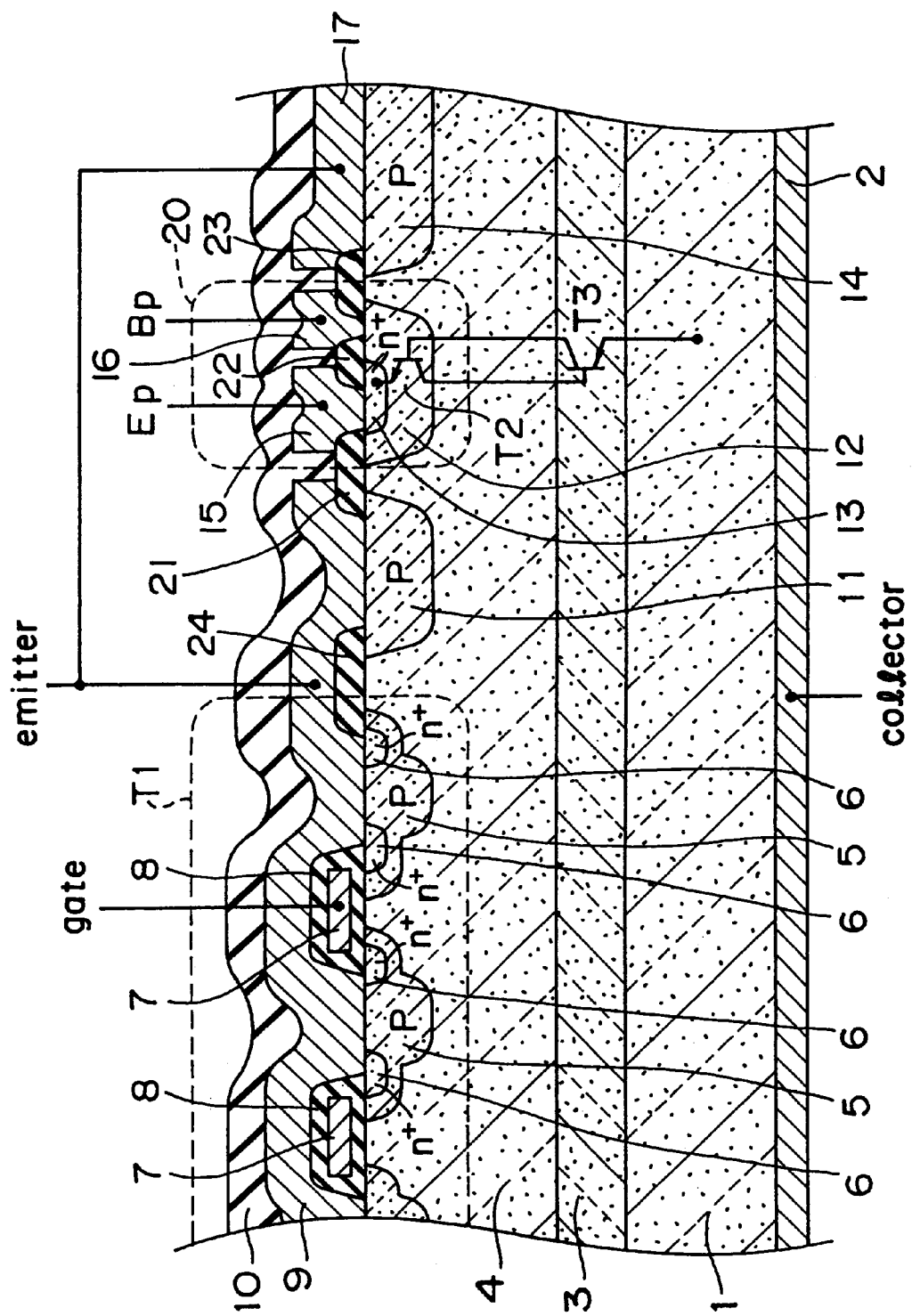
FIG. 1 is a sectional view schematically showing the construction of the semiconductor device according to the fist embodiment of the present invention.

According to the embodiment 1 of the semiconductor device 50, the insulated gate bipolar transistor T1 is configured as described below. First, for example, an n+ epitaxial layer 3 in which an n-type silicon containing relatively much n-type impurities is epitaxially grown is formed on a p-type substrate 1 made of p-type silicon, and an n− epitaxial layer 4 in which an n-type silicon with relatively less n-type impurities is epitaxially grown is formed on said n+ epitaxial layer 3. Then, a p-type region 5 where the p-type impurities are diffused is formed at a certain distance in the n− epitaxial layer 4, and an n+ region 6 where the n-type impurities are diffused is formed at two places in each p-type region 5. And, for example, a gate 7 made of a polysilicon or a silicon oxide which is insulated by a gate oxide film 8 is formed thereon, and an Al wiring 9 is further formed thereon as an emitter electrode, thus configuring the insulated gate bipolar transistor T1 as shown in FIG. 1. A metallized layer is also formed on the other side of the p-type substrate 1 as a collector electrode.

According to the first embodiment of the semiconductor device 50, the thyristor 20 is configured by the use of a p-type region 12 which can be formed simultaneously when the p-type region 5 of the insulated gate bipolar transistor T1 is formed as described below.

That is, the thyristor 20 is composed of an n-type region (n+ region) 13 where the n-type impurities are diffused over a part of the p-type region 12, the emitter electrode 15 so as to make contact with the n-type region (n+ region) 13 between the insulating films 21 and 22, and the base electrode 16 so as to make contact with the p-type region 12 between the insulating films 22 and 23. A collector electrode of the thyristor 20 is a metallized layer 2, and both the insulated gate bipolar transistor T1 and the thyristor 20 share the metallized layer 2 as a collector electrode. Both the emitter electrode 15 and the base electrode 16 are also formed by electrically separating from each electrode of the insulated gate bipolar transistor T1.

With such construction as shown in FIG. 1, the n-type region 13 and the p-type region 12 and the n− epitaxial layer 4 make up an npn transistor T2, and the p-type region 12 and n− epitaxial layer 4 plus n+ epitaxial layer 3 and the p-type substrate 1 make up a pnp transistor T3. Thus, the npn transistor T2 and the pnp transistor T3 comprise the thyristor 20.

Also, a p-type region 11 which is separated from the p-type regions 12 and 5 is formed in the n− epitaxial layer 4 between the insulated gate bipolar transistor T1 and the thyristor 20, and the p-type region 11 establishes connection with the emitter electrode 9 of the insulated gate bipolar transistor T1 between the insulating films 24 and 21. Thus, by forming the p-type region 11 which is connected with the emitter electrode 9, it is made possible to prevent the withstanding voltage characteristics from being reduced between the insulated gate bipolar transistor T1 and the thyristor 20.

Figure 2:
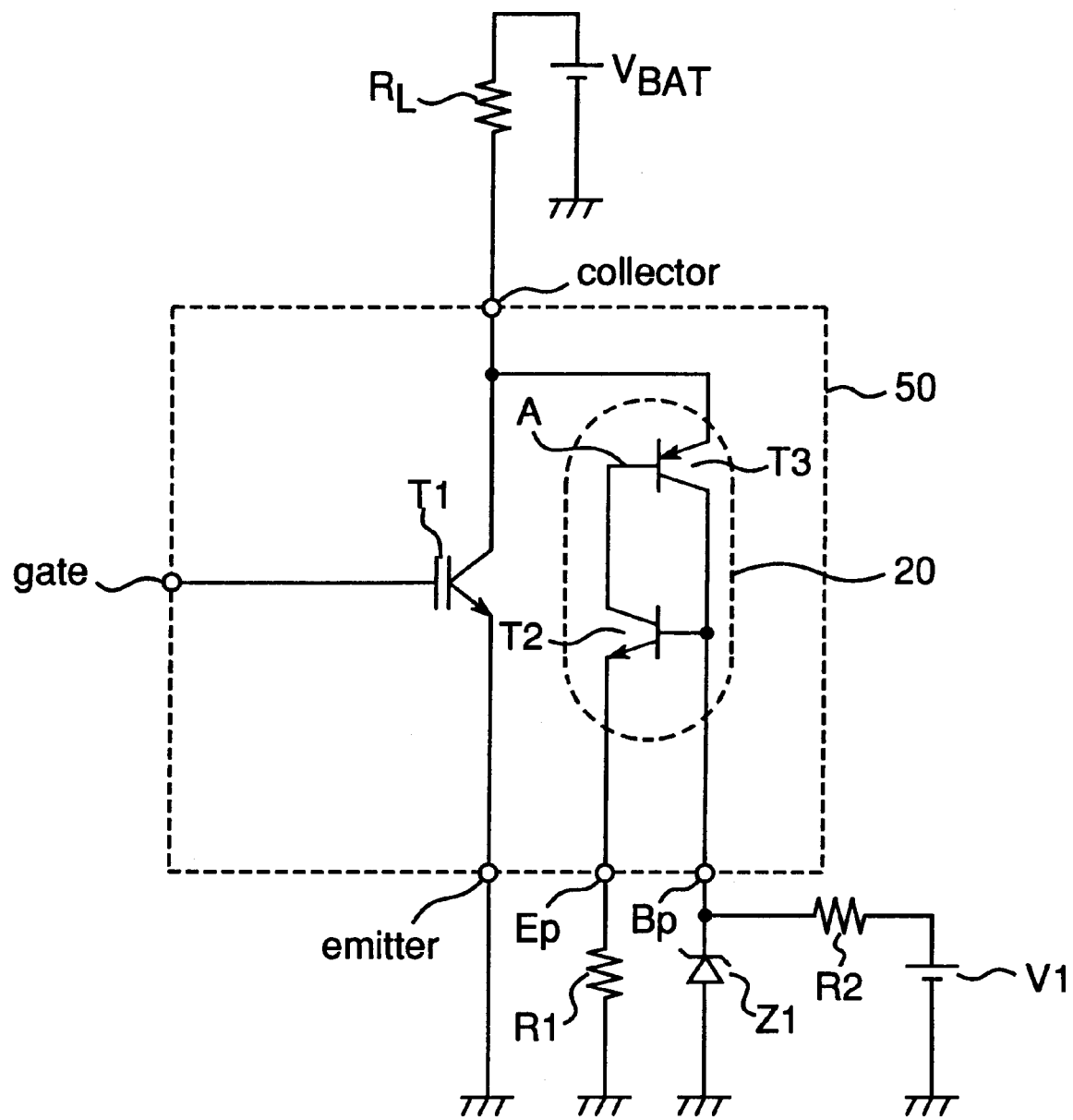
FIG. 2 is a circuit diagram of the semiconductor circuit comprising the semiconductor device of the first embodiment and its peripheral circuits.

FIG. 2 shows a circuit comprising an equivalent circuit of the semiconductor device thus configured and one example of external circuit to be connected. In FIG. 2, a portion indicated by numeral 50 and enclosed by a dotted line denotes an equivalent circuit of the semiconductor device of the first embodiment, and a portion indicated by numeral 20 denotes an equivalent circuit of the thyristor. Also in FIG. 2, a symbol Bp denotes a base terminal corresponding to the base electrode 16 of the thyristor 20 in FIG. 1, and a symbol Ep denotes an emitter terminal corresponding to the emitter electrode 15 of the thyristor 20 in FIG. 1. Besides, a diode Z1 connected to the base terminal Bp is a zener diode which serves to limit a voltage applied to the base terminal Bp to not greater than a certain voltage, and a resistor R1 connected to the emitter terminal Ep serves to supply a current required to maintain the operation of the thyristor 20. Furthermore, a resistor R2 and a power supply V1, which are connected to the base terminal Bp in parallel with the zener diode Z1, constitute a start-up circuit to turn on the thyristor 20, in which a voltage and a resistance are set so that the transistors T2 and T3 turn out to be ON while a bias voltage is applied to the collector.

Figure 3:
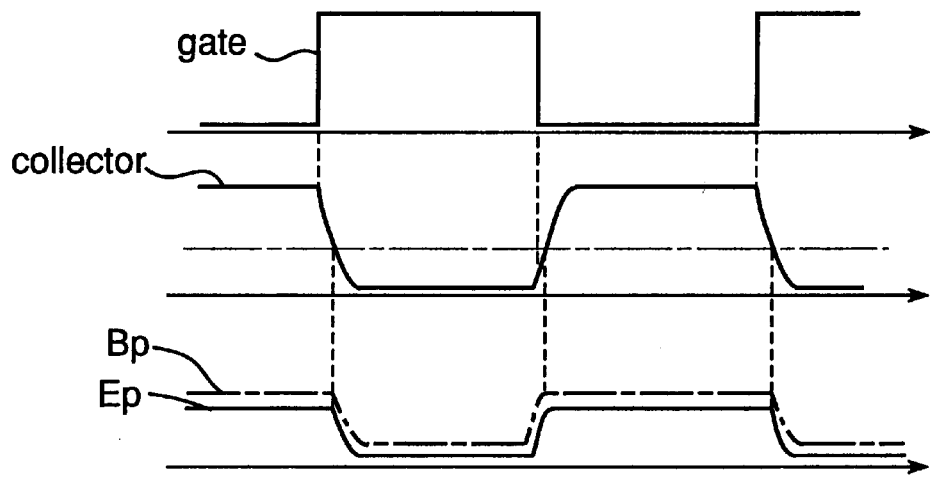
FIG. 3 is a graph schematically showing the collector voltage and a voltage at the base terminal Bp and the emitter terminal Ep with respect to the gate voltage of the semiconductor device of the first embodiment.

FIG. 3 shows each output waveform of the collector, the base terminal Bp and the emitter terminal Ep with respect to the input waveform into the gate when thus configured circuit as shown in FIG. 2 is operated.

That is, when the bias voltage is applied to the collector, both transistors T2 and T3 turn to be ON by the start-up circuit made up of the resistor R2 and the power supply V1. At this time, the voltage of the base terminal Bp is limited to the yield voltage of the zener diode Z1. Besides, the voltage of the emitter terminal Ep becomes lower than that of the base terminal Bp by a voltage in the direction of forward between the base and the emitter of the transistor T2.

Then, the insulated gate bipolar transistor T1 turns to be ON and the collector voltage is reduced, which in turn reduces a potential at point A which serves as a base of the transistor T2 and a collector of the transistor T2. Accordingly, between the collector and the base of the transisstor T2 is forward biased, thereby an h parameter hfe which is a current amplification factor is suddenly decreased and a voltage of the emitter terminal Ep and the base terminal Bp is abruptly decreased in accordance with a change of the h parameter hfe of the transistor T2. Thus, the voltage of the emitter terminal Ep varies according to the collector voltage and is limited to less than the yield voltage of the zener diode Z1. Therefore, it is made possible to connect a transistor circuit of relatively low withstanding voltage and so forth directly with the emitter terminal Ep.

Also according to the semiconductor device of this first embodiment, the p-type region 12 and the n-type region 13 can be formed simultaneously with the p-type region 5 and the n-type region 6, respectively, by means of diffusion in the n-type epitaxial layer 4, and the emitter electrode 15 and the base electrode 16 can be formed concurrently when forming the emitter electrode 9. Accordingly, the semiconductor device of first embodiment does not contribute to increase the production cost of the semiconductor device because it is not necessary to add a step of forming the thyristor 20.

Embodiment 2

Figure 4:
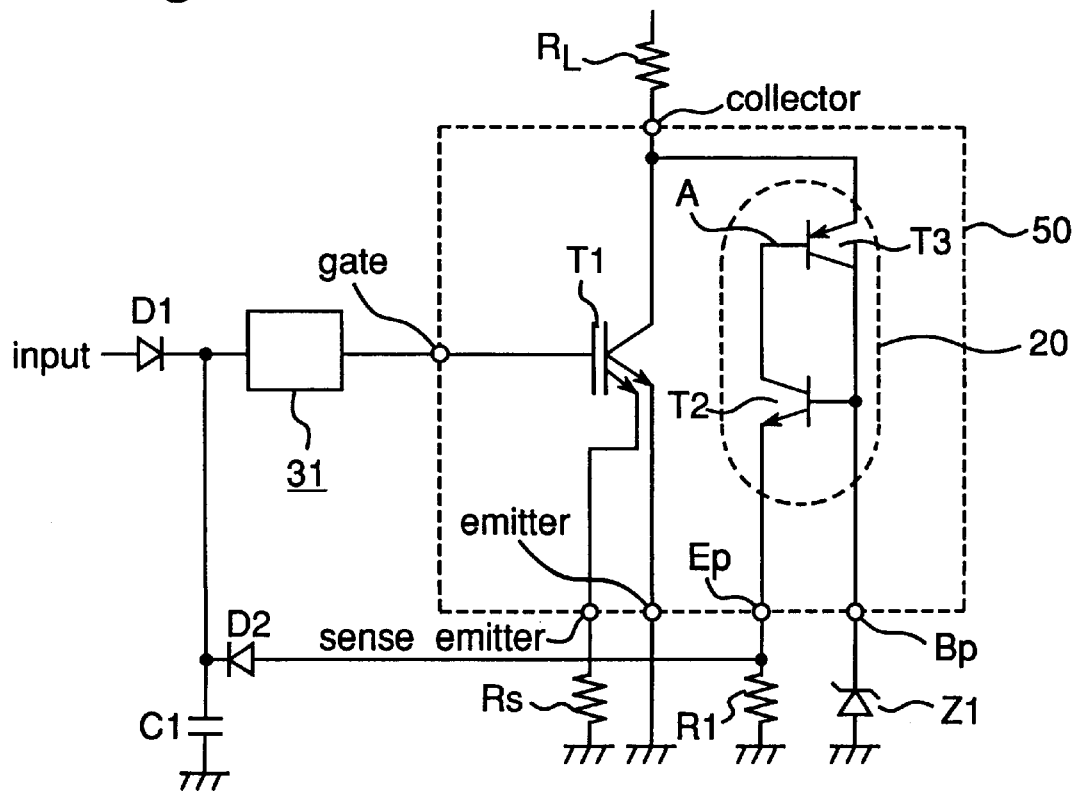
FIG. 4 is a circuit diagram showing the semiconductor circuit according to the second embodiment of the present invention.

As shown in FIG. 4, the semiconductor device of the second embodiment is configured using the semiconductor device 50 as described in the first embodiment, characterized in that an anode terminal of the diode D2 is connected to the emitter terminal Ep of the semiconductor device 50 and that a current is put out to a control circuit 31 through said diode D2. A cathode terminal of the diode D2 is also grounded through a capacitor C1. And, the control circuit 31 which is connected through the diode D1 to an input terminal is connected with the gate of the insulated gate bipolar transistor T1, thereby controlling the insulated gate bipolar transistor T1.

The semiconductor circuit of the second embodiment shows a construction where the insulated gate bipolar transistor T1 is provided with a sense emitter terminal, and a current flowing out of the sense emitter terminal is converted into a voltage by a resistor Rs, thus exercising control in accordance with the voltage produced in the circuit (for example, a feedback control by imposing limits so as not to flow a current in excess of a certain level). Since the insulated gate bipolar transistor having the sense emitter terminal is configured so that there is a certain correlation with respect to the emitter current at less current value than that of flowing through the emitter, it is made possible to detect a current flow without loss of power-switch characteristics by inserting a resistor between the emitter and a ground.

With this construction, a control circuit 31 can be operated by a current flowing through the diode D2, bringing about the following various advantages.

That is, in order to realize a system where the insulated gate bipolar transistor is controlled using a voltage applied to the gate, a control circuit is normally connected between the gate and the emitter. With this construction, the control circuit can be operated properly in the circuit construction of the prior art, with the gate biased by a positive voltage, but the circuit will not be operated if a gate bias is 0 (zero).

On the other hand, since a current is drawn out from the collector of the transistor T1 and then used as a power source to operate the control circuit 31 in the semiconductor circuit of the second embodiment, the control circuit can be operated even if the gate of the transistor T1 is zero bias. Thereby, it is also made possible to configure a malfunction control circuit by exercising control so that the insulated gate bipolar transistor does not turn to be ON for a certain duration immediately after it turns from ON to OFF.

Also, for example, since it is not necessary to provide the control circuit 31 with a power line which serves to supply the power to the control circuit 31 when a circuit containing the control circuit 31 shown in FIG. 4 is integrated on a single semiconductor substrate, it is made possible to configure a highly integrated circuit.

Embodiment 3

Now the third embodiment of the present invention will be described below.

Figure 5:
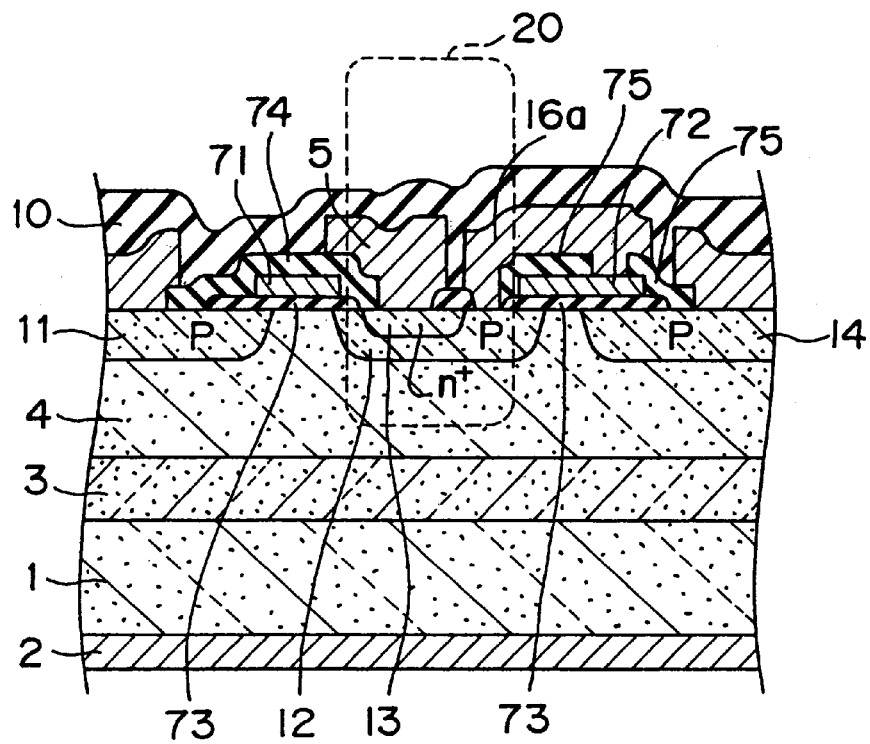
FIG. 5 is a sectional view schematically showing the construction of the semiconductor device according to the third embodiment of the present invention.
Figure 5:
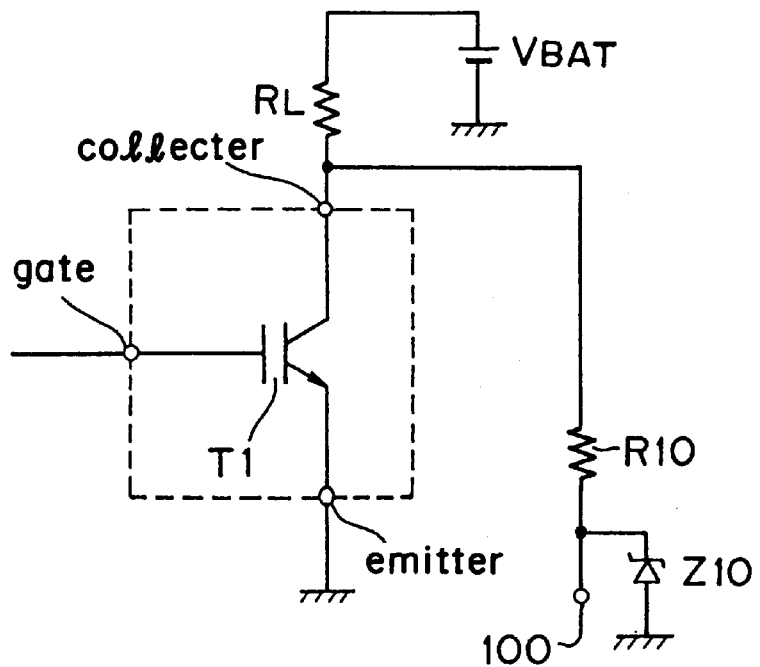

The semiconductor device of the third embodiment is characterized in that, as shown in FIG. 5, both sides of the thyristor 20 is configured similarly to the gate of the insulated gate bipolar transistor T1 in the semiconductor device of the first embodiment to prevent the withstanding voltage characteristics of a device from being degraded. The structure other than above is configured in the same manner as the first embodiment. In FIG. 5, the same reference symbols are used for the equivalent elements of the first embodiment.

That is, an electrode 71 made of the same material as the gate 7 is formed through an insulating film 73 on the n$^-$ epitaxial layer 4 disposed between the p-type regions 12 and 11, and an insulating film 74 is formed so as to cover the electrode 71. An electrode 72 made of the same material as the gate 7 is formed through the insulating film 73 on the n$^-$ epitaxial layer 4 disposed between the p-type regions 12 and 14, and an insulating film 75 is formed so as to cover the electrode 72. Furthermore, a base electrode 16a of the thyristor 20 establishes connection with the electrode 72 through an opening formed on the insulating film. 75.

The electrode 71 is formed so as to cover a part of the p-type regions 12 and 11, and the electrode 72 is formed so as to cover a part of the p-type regions 12 and 14. The electrode 71 also establishes connection with the electrode 72.

In the semiconductor device of the third embodiment thus configured, the base terminal Bp can be made to be relatively high potential, thereby making it possible to configure so as to draw out relatively high voltage from the emitter terminal Ep.

That is, with the structure of the first embodiment, since the distribution of electric field near the p-type region 12 is disturbed when attempting to raise a voltage of the base terminal Bp and then a portion of partly weak withstanding voltage is caused by the disturbance, the withstanding voltage characteristics will be deteriorated as a whole.

On the other hand, with the construction of the third embodiment, the disturbance can be mitigated by the distribution of electric field near the p-type region 12, thereby making it possible to prevent the withstanding voltage characteristics from being reduced even if a voltage of the base terminal Bp is set to relatively high voltage.

As described in detail above, the semiconductor device of the present invention comprising the insulated gate bipolar transistor having the thyristor, since the thyristor comprises a p-type region where a p-type impurity diffuses over a part of the n-type semiconductor layer, an n-type region where an n-type impurity diffuses over a part of the p-type region, an emitter electrode formed contiguously to the n-type region, a base electrode formed contiguously to the p-type region, and a collector electrode which is used in common with the insulated gate bipolar transistor, the limited voltage or current of the collector voltage or current of the insulated gate bipolar transistor can be drawn out from the emitter electrode.

With the semiconductor device thus configured, the p-type region and the n-type region can be formed concurrently with the p-type region and n-type region of the insulated gate bipolar transistor, respectively, thereby making it possible to produce the semiconductor device at low cost.

Therefore, according to the semiconductor device of the present invention, the limited current or voltage can be drawn out from the collector of said insulated gate bipolar transistor by the thyristor, and an inexpensive semiconductor device can also be provided.

Also according to the semiconductor device of the present invention, by forming the second p-type region which is formed by diffusing the p-type impurity between the insulated gate bipolar transistor and the thyristor, it is made possible to prevent the withstanding voltage characteristics from being degraded and to provide a semiconductor device having the same withstanding voltage characteristics as that of the prior art.

Furthermore, according to the semiconductor device of the present invention, when forming the second p-type region in the n-type semiconductor layer at both sides of the thyristor, forming an electrode made of the same material as that used for the gate through an insulating film so as to cover between the p-type region and the second p-type region and a part of the p-type region and the second p-type region, and then connecting the electrode and the emitter electrode, it is made possible to effectively prevent degradation of withstanding voltage characteristics even in a construction where a relatively high voltage is put out from the emitter electrode.

Also, since the semiconductor device of the present invention is provided with the semiconductor device and the zener diode which is connected with the base electrode, it is made possible to positively restrict a voltage of the base electrode to less than a yield voltage of the zener diode, thereby drawing out a voltage less than the base voltage from the emitter electrode.

Also according to the semiconductor device of the present invention, when connecting different diode other than the zener diode to the emitter electrode, it is made possible to draw out a current from the emitter electrode without impairing the operation of the thyristor.

Furthermore, in the semiconductor circuit, it is made possible to connect, for example, a malfunction preventive control circuit by connecting a control circuit through the diode to the semiconductor device.

What is claimed is:

1. A semiconductor device comprising:
   an insulated gate bipolar transistor including a gate formed over a gate insulator on an n-type semiconductor layer formed on a p-type semiconductor substrate and a transistor emitter electrode formed contiguously to at least one transistor emitter region formed in said n-type semiconductor layer; and
   a thyristor comprising a p-type region formed in said n-type semiconductor layer apart from said at least one emitter region, said emitter electrode, said gate and said gate insulator, an n-type region formed in said p-type region, a thyristor emitter electrode formed contiguously to said n-type region, a base electrode formed contiguously to said p-type region, and a collector electrode formed as a common collector electrode shared with said insulated gate bipolar transistor,
   wherein at least the thyristor base electrode and the emitter electrode of said insulated gate bipolar transistor are provided as so as to be separately connected with separate external elements or circuits, and
   wherein a second p-type region is formed in said n-type semiconductor layer between said insulated gate bipolar transistor and said thyristor.

2. A semiconductor device comprising:
   an insulated gate bipolar transistor including a gate formed over a gate insulator on an n-type semiconductor layer formed on a p-type semiconductor substrate and a transistor emitter electrode formed contiguously to at least one transistor emitter region formed in said emitter electrode formed contiguously to at least one transistor emitter region formed in said n-type semiconductor layer; and
   a thyristor comprising a p-type region formed in said n-type semiconductor layer apart from said at least one emitter region, said emitter electrode, said gate and said gate insulator, an n-type region formed in said p-type region, a thyristor emitter electrode formed contiguously to said n-type region, a base electrode formed contiguously to said p-type region, and a collector electrode formed as a common collector electrode shared with said insulated gate bipolar transistor,
   wherein at least the thyristor base electrode and the emitter electrode of said insulated gate bipolar transistor are provided as so as to be separately connected with separate external elements or circuits, and
   wherein additional p-type regions are formed in said n-type semiconductor layer at both sides of said p-type region and additional electrodes made of the same material as said gate are formed covering an insulating film between different sides of said p-type region and a corresponding one of said additional p-type regions, wherein said additional electrodes are connected together and one of the additional electrodes is connected to the base electrode.

3. A circuit comprising: semiconductor device comprising,
   an insulated gate bipolar transistor including a gate formed over a gate insulator on an n-type semiconductor layer formed on a p-type semiconductor substrate and a transistor emitter electrode formed contiguously to at least one transistor emitter region formed in said emitter electrode formed contiguously to at least one transistor emitter region formed in said n-type semiconductor layer, and
   a thyristor comprising a p-type region formed in said n-type semiconductor layer apart from said at least one emitter region, said emitter electrode, said gate and said gate insulator, an n-type region formed in said p-type region, a thyristor emitter electrode formed contiguously to said n-type region, a base electrode formed contiguously to said p-type region, and a collector electrode formed as a common collector electrode shared with said insulated gate bipolar transistor,
   wherein at least the thyristor base electrode and the emitter electrode of said insulated gate bipolar transistor are provided as so as to be separately connected with separate external elements or circuits; and a zener diode connected with the base electrode of said thyristor.

4. The circuit according to claim 3, further comprising another diode connected to the emitter electrode.

5. The circuit according to claim 4, further comprising a control circuit connected to said another diode and configured to control said semiconductor device.

* * * * *